(12) United States Patent
Kim et al.

(10) Patent No.: US 6,956,386 B2
(45) Date of Patent: Oct. 18, 2005

(54) MICRO-CANTILEVER TYPE PROBE CARD

(75) Inventors: Dong Il Kim, Seongnam-Si (KR); Byung Chang Song, Suwon-Si (KR); Ha Poong Jeong, Suwon-Si (KR)

(73) Assignee: Amst Company Limited, Kyurggi-Do (KR)

( * ) Notice: Subject to any disclaimer, the term of this patent is extended or adjusted under 35 U.S.C. 154(b) by 6 days.

(21) Appl. No.: 10/633,022

(22) Filed: Aug. 1, 2003

(65) Prior Publication Data

US 2005/0024073 A1 Feb. 3, 2005

(51) Int. Cl.$^7$ .............................................. G01R 31/02
(52) U.S. Cl. ..................... 324/754; 324/158.1; 324/758
(58) Field of Search ................. 324/754, 758, 324/765, 158.1, 761, 72.5, 757, 763; 439/482, 700; 29/892, 893; 438/14–18

(56) References Cited

U.S. PATENT DOCUMENTS

| | | | |
|---|---|---|---|
| 4,523,144 A | 6/1985 | Okubo et al. ................ 324/158 |
| 4,757,256 A | * 7/1988 | Whann et al. ............... 324/758 |
| 4,799,009 A | 1/1989 | Tada et al. ................... 324/158 |
| 4,961,052 A | 10/1990 | Tada et al. ................... 324/158 |
| 5,172,050 A | 12/1992 | Swapp ........................ 324/158 |
| 5,723,347 A | 3/1998 | Hirano et al. ................... 437/8 |
| 6,198,297 B1 | * 3/2001 | Riccioni ...................... 324/754 |
| 6,414,501 B2 | * 7/2002 | Kim et al. ................... 324/754 |
| 6,696,849 B2 | * 2/2004 | Ban et al. .................... 324/760 |

FOREIGN PATENT DOCUMENTS

| | | |
|---|---|---|
| KR | 20-0200534 | 10/2000 |
| KR | 10-0319130 | 4/2002 |
| KR | 10-0328540 | 11/2002 |
| WO | WO 02/15260 A1 * 2/2002 | ........... H01L/21/66 |

* cited by examiner

*Primary Examiner*—Robert Pascal
*Assistant Examiner*—Jimmy Nguyen
(74) *Attorney, Agent, or Firm*—Ohlandt, Greeley, Ruggiero & Perle L.L.P.

(57) ABSTRACT

A probe card has probe sections with silicon probes formed on an insulated circuit board that are connected by an adhesive on the supporting structures. The supporting structures are supported by fixing structures with each of the fixing structures being fixed on the circuit board. The probe card has the probe section's wiring and the circuit board's wiring being electrically connected by a metallic wiring and the sub printed circuit and the pogo pin electrically connected by an anisotropic conducting film with the sub printed circuit board and the pogo pin. A metallic layer is formed by the plating of the probe in the probe section. This reduces the manufacturing costs by enabling the damaged probes during manufacturing to be discarded and the others being used continually.

1 Claim, 10 Drawing Sheets

MICRO-CANTILEVER TYPE PROBE CARD

BACKGROUND OF THE INVENTION

1. Field of the Invention

The present invention relates to a probe card to inspect the electric properties of the micro electronic device. More particularly, the present invention relates to a probe card structure wherein, when the probes fabricated by etching the silicon substrate are mounted on the main circuit board, the assembly characteristics and the convenience of circuit connection are improved.

2. Description of the Related Art

Generally, during or after manufacturing an electrical circuit device such as a semiconductor integrated circuit device, or before attaching the lead frame to the device, the device should be inspected whether the device was manufactured according to the specifications, and whether the measured whole or partial electric properties coincides with the desirable electric properties for the designed device. The inspection device used to inspect the device is the probe station. A probe card is one of the main parts which are mounted on the probe station.

The conventional probe card (1) consists of 2 main parts as shown in FIG. 1 and FIG. 2. One part of the probe card (1) is a slender and sharp probe (1a) like a needle. Another part is a circuit board (1b) which structurally supports the probe (1a), and electrically connects the probe station (not illustrated) and the probe (1a).

The probe card (1) with such structure is fixed under the insertion ring which is supported by the head plate (5) of the probe device (2) as shown in FIG. 3. A work table (7) is installed below the probe card (1). The work table (7) may be moved 3-dimensionally (X, Y, Z axes). A semiconductor wafer (3) wherein the device to be inspected is fabricated is placed on the work table (7). The probe card (1) electrically connects the electric signal measurement equipment (not illustrated) in the probe station (2) to the electric pads (4) on a single or multiple devices.

Hereinafter, the conventional process of measuring the electric characteristics of the semiconductor device by using such probe station (2) is explained. First, the probe card (1) is fixed under the insertion ring which is supported by the head plate (5) of the probe station (2), and the semiconductor wafer (3) wherein the device to be measured is fabricated is fixed on the work table (7). Then, the work table (7) is moved in the direction of the X and Y axes, then align the position of the electric pad (4) of the device to be measured on the semiconductor wafer (3) with tip of the probe (1a) of the probe card (1) perpendicularly. Then, the work table (7) is moved in the direction of the Z axis to contact the probe (1a) with the pad (4). If the signal measurement equipment (not illustrated) of the probe device (2) outputs an electric signal for the measurement of the device's electric characteristics, then the electric signal is transmitted to the circuit board (1b) of the probe card (1) through the pogo pin (6). The electric signal is transmitted to the tip of the probe (1a) through the circuit board (1b)'s electric wiring (not illustrated), and thus, it is supplied into the device through the pad (4). After this, the electric response signal generated from the device is transmitted by reverse order of the above signal path to the signal-measuring equipment.

The conventional probe card is called the epoxy type or the tungsten needle type. This type of card is one that measures the electric characteristics of the device which is fabricated on the semiconductor wafer (3) by fixing a probe of tungsten which looks like a needle with a sharp tip to the circuit board (1b) using epoxy.

The manufacturing method of this type of probe card is disclosed in many patents such as U.S. Pat. No. 4,523,144, U.S. Pat. No. 4,799,009 and Korean Utility Model Patent No. 200,534. However, recently, semiconductor device's pads have sharply decreased in size and increased in density due to the high integration of the semiconductor devices. Now, it is common for pads less then tens of $\mu$ms in size in array with spaced by $\mu$ms in a device. Also a single probe card may be required to contain about 4,000 probes.

Because the tungsten probe is relative thick (thickness of hundreds of $\mu$ms), it is very difficult to install the required number of probes to the probe card's circuit board to simultaneously measure multiple devices. It is also difficult to accurately position the probe. Moreover, because the probe is long and the probe's lengths are all different, the electric interference may occur when an electric signal is transmitted through the probe and it is difficult to control the electrical impedance without shielding. As a result, it is difficult to apply the conventional method to measuring high-speed devices such as the Rambus Dynamic Random Access Memory. Also, the scrubbing action of the probe on the pad of the device is large, often exceeding tens of microns due to long needle length and unevenness of the probe tip height. This can cause the probe tip to be located outside the pad after the scrubbing action.

New types of probe cards are being developed to overcome these problems. Requirements of the new card are many, and among them are fine pitch array, superior electrical characteristics and small scrub mark.

When manufacturing probes, it is important that each of the probes must make contact with the corresponding pad of the device that was fabricated on the semiconductor wafer to be inspected. Further, each of the probes must apply a predetermined range of pressure to the pad. Therefore, the tips of the probes must be arrayed uniformly, and have a good planarity. Further, each of the probes must have a predetermined value of elasticity. If the probes have elasticity to perform elastic deformation, the probe card can be used to conduct the required electric measurement, even though there is a small error in the planarity of the probe's tip or an error in the location of the device's pad, for example, if the device's semiconductor wafer wherein the device is fabricated is not completely flat and has a little distortion. The manufacturing method of these probes has been disclosed in the U.S. Pat. No. 4,961,052, U.S. Pat. No. 5,172,050, and U.S. Pat. No. 5,723,347. The inventors of the present invention have Korean Patent No. 319,130, No. 328,540 and U.S. Pat. No. 6,414,501 for the probe card where the microscopic cantilever probe fabricated on the semiconductor wafer is attached to the insulating circuit board.

SUMMARY OF THE INVENTION

However, in the known probe card, it is not easy to control the location, the planarity, and the electric wiring. Further, because all the probes are provided on the same circuit board as a set, it is inevitable to replace all of the probes if some of the probes become defective. Further, because a separate circuit board is used between the probes and the main circuit board, the bending characteristics of the circuit board causes degrading of the probe's planarity, and also causes increase of the manufacturing costs of the probe card. Further, when the required test area of the device is too large to manufacture, it is impossible to manufacture a proper probe card with good planarity. Moreover, if defects appear on some of the probes while using the probe card for the measurement of the device's characteristics, the whole circuit board had to be replaced, causing increase in the maintenance cost.

Therefore, the object of the present invention is to provide a probe card wherein multiple probes positioned very closely and firmly together while the probe's location and whole planarity are controlled, and wherein the electric wiring is easily made.

Another object of the present invention is to provide a probe card wherein the degrading of the probe's planarity due to the bending characteristics of the circuit board is prevented, and the repairing of the malfunctioning probe is enabled and the maintenance cost lowered.

Another object of the present invention is to provide a probe card wherein even if the area of the probe array is so large that the size exceeds the manufacturing limit such as 5" or 6", it would be possible to overcome this manufacturing limit.

Another object of the present invention is to provide a probe card wherein even if some of the probes became defective while measuring the device's characteristics, it would be possible to replace the defective part, thus, reducing the cost.

To achieve these objects, the probe card structure according to the present invention comprises:

probe sections comprising an insulated circuit board; probes of silicon material which are fabricated on the insulated substrate; and conductive wires electrically connected to the tips of the probes and formed on the insulated substrate;

supporting structures that support each of the probe sections;

fixing structure that fixes the supporting structures together;

printed circuit that is attached to the fixing structure, and has conducting wires and can be connected electrically to the measurement device that transmits the measurement signal to the device to be measured; and wiring connection means for electrically connecting the wiring of the probes and the wiring of the printed circuit.

Preferably, the supporting structures and the fixing structure are made of invar, kovar, quartz or ceramic.

Preferably, the wiring of the probe section and the wiring of the printed circuit board is electrically connected by another printed circuit, herein called sub circuit board, which can be either flexible or non-flexible printed circuit. Further, the wiring of the probe section and the wiring of the sub circuit board may be electrically connected by the metallic wire formed by the wire bonding method or by the anisotropic conducting film.

Preferably, at least a capacitor may be provided on the printed circuit to decrease the electric noise.

Preferably, the contact pad of the sub circuit board and the contact pad of the circuit board may be electrically connected by the pogo pin or may be electrically connected perpendicularly by silicon rubber material with imbedded array of metallic wire with a diameter of than 35 $\mu$m or less arrayed at 0.07~0.15 mm vertical intervals and at 0.35 mm~0.45 mm horizontal intervals.

Preferably, nickel plating or gold plating may be formed in the probes of probe section and wiring, and a groove may be formed in the tip of the probes before performing the plating.

Preferably, at least a screw may be provided in the supporting structure to adjust the 3-dimensional locations of the supporting structures and the fixing structures.

DESCRIPTION OF THE PREFERRED EMBODIMENTS

Reference will now be made in detail to the present invention as illustrated in the accompanying drawings.

Figure 4:
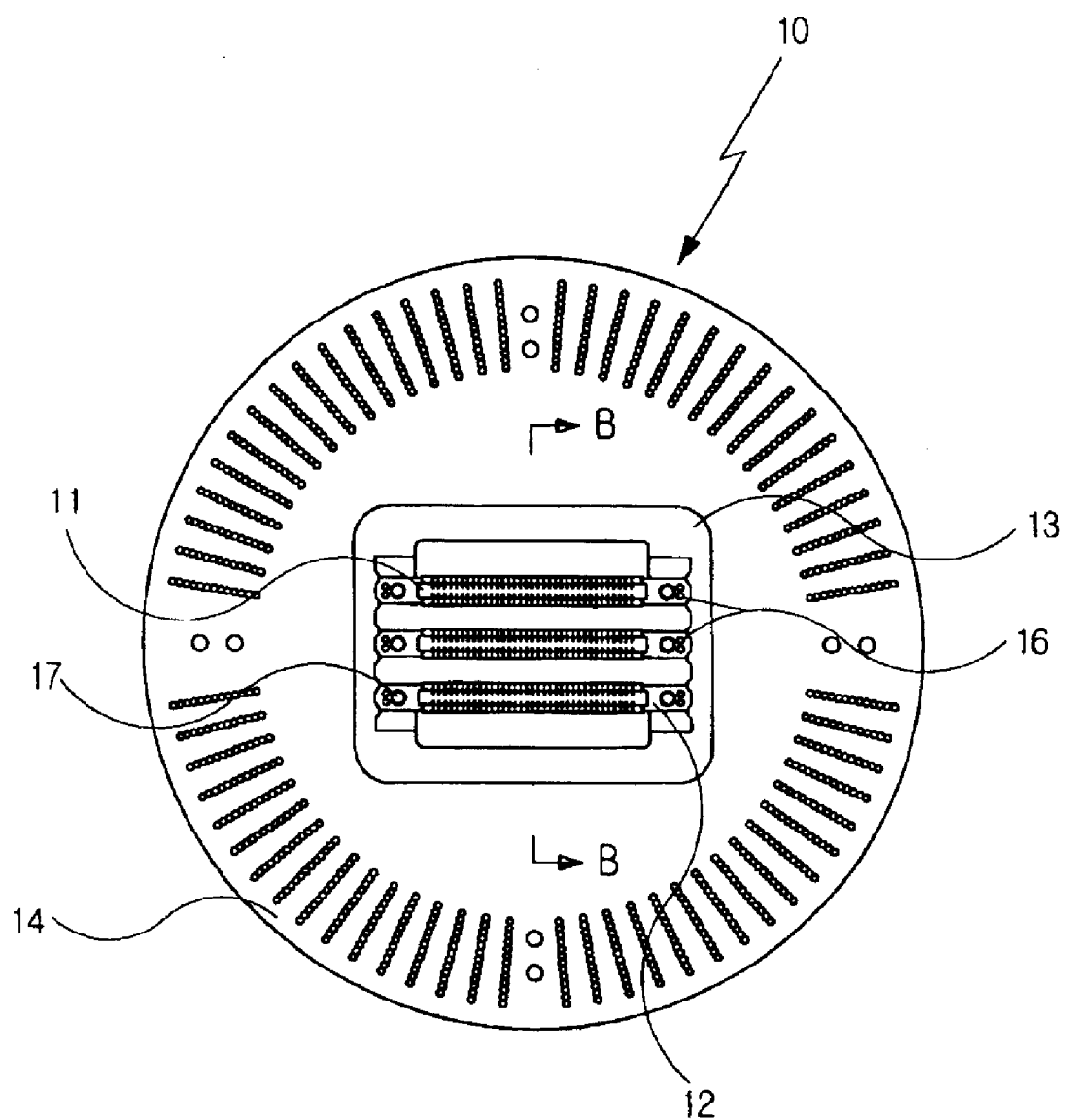
FIG. 4 is a plane figure of the probe card according to the present invention.
Figure 5:
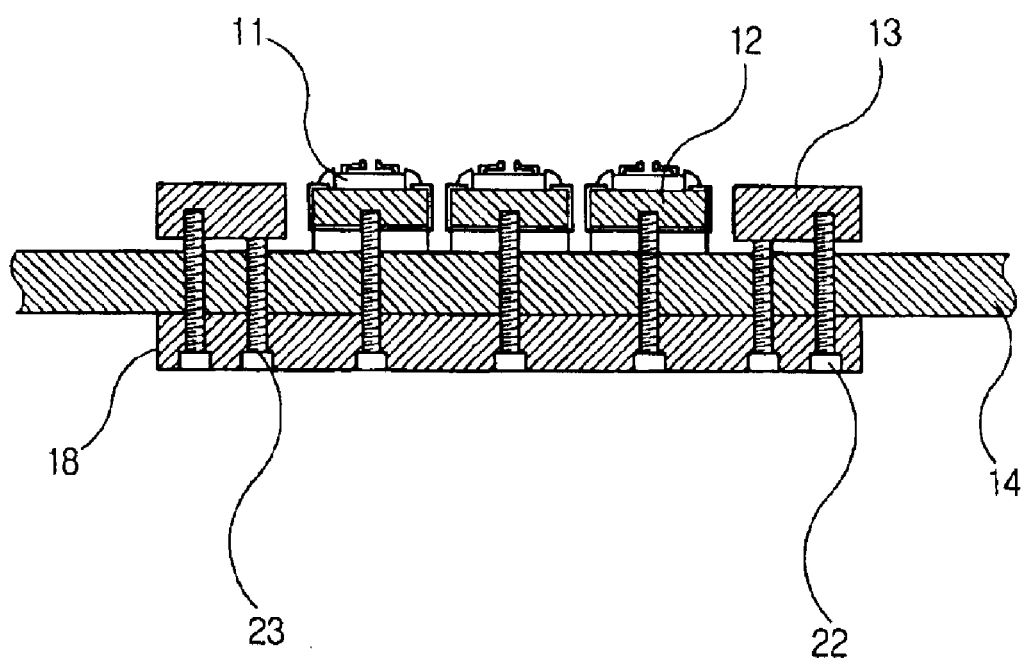
FIG. 5 is a cross sectional view of the probe card along the line B—B in FIG. 4.

FIG. 4 is a plane figure of the probe card applied to the probe card structure of the present invention. FIG. 5 is a cross sectional view of the probe card along the line B—B in FIG. 4, FIG. 6 illustrates a disassembled probe card of FIG. 4.

Figure 6:
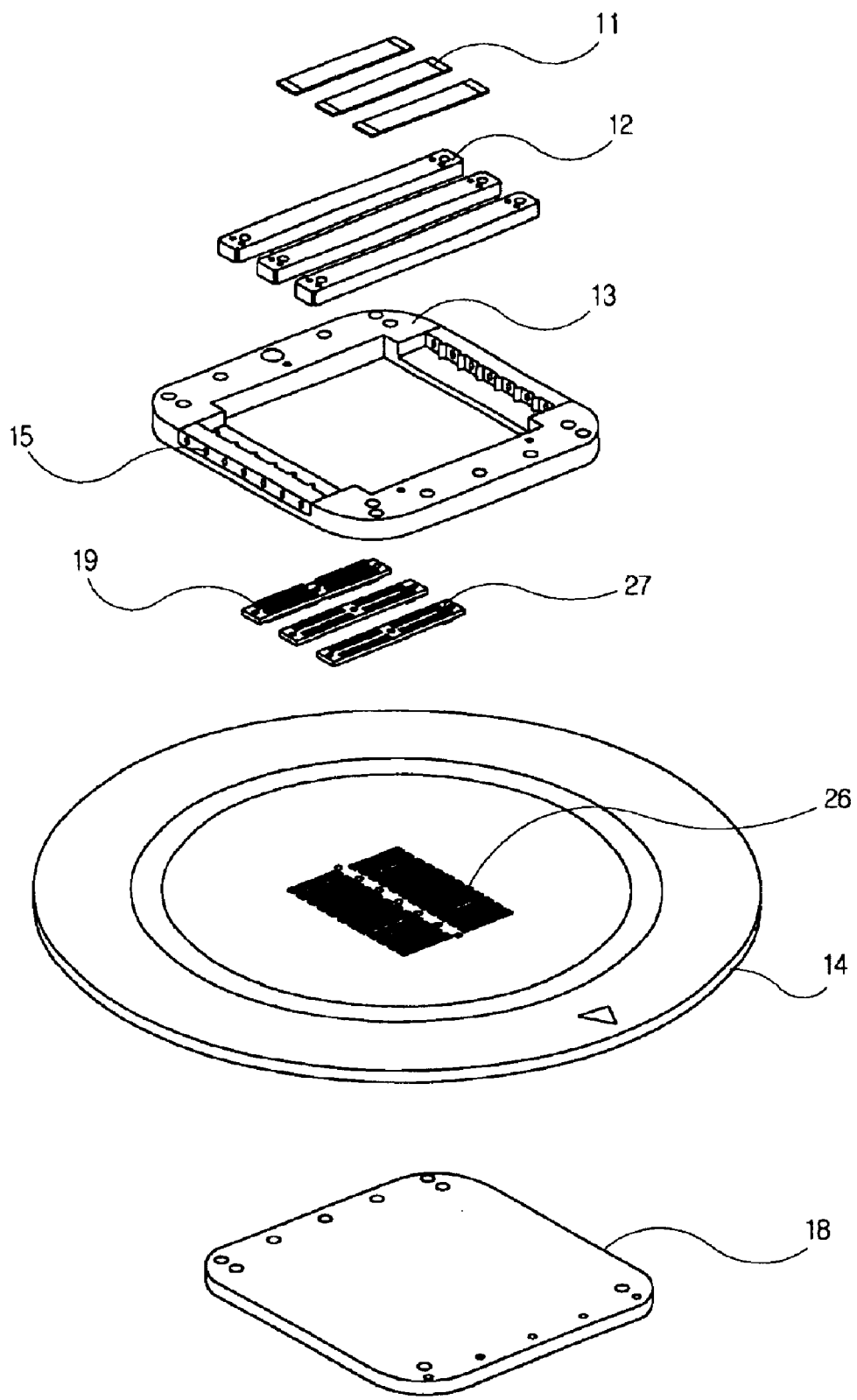
FIG. 6 illustrates the disassembled probe card.
Figure 8:
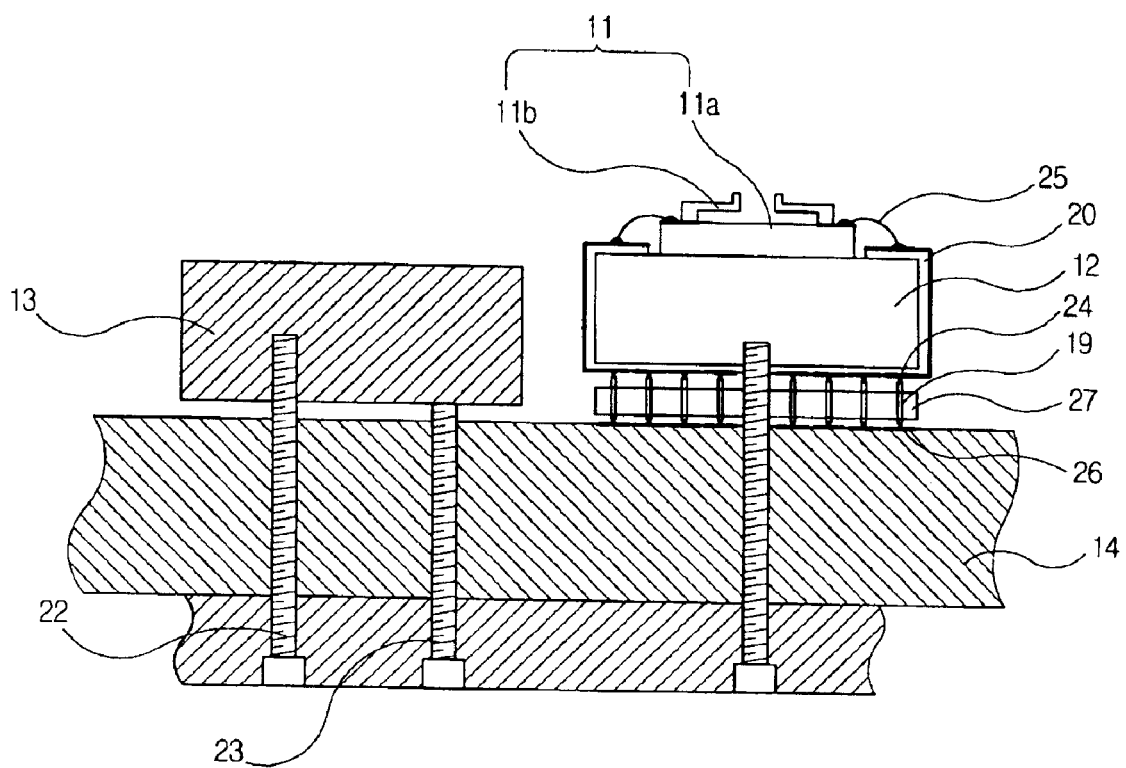
FIG. 8 illustrates the wiring between the probe section and printed circuit board which are provided in the probe card structure of the present invention.

Referring to FIGS. 4, 5 and 6, in the probe card (10) of the present invention, the probe sections (11) are fixed on the linear supporting structures (12) by adhesives (not illustrated). The supporting structures (12) are fixed on the rectangular frame shaped fixing structures (13) having a rectangular shaped hole. The fixing structure (13) is fixed on the center of the upper surface of the circular circuit board (14). A reinforcing plate (18) is installed on the lower surface of the circuit board (14). As illustrated in FIG. 8, the probe sections (11) and the circuit board (14) are electrically connected by the pogo pin (19), the flexible printed circuit (FPC) (20) and the metal wire (25).

Figure 7:
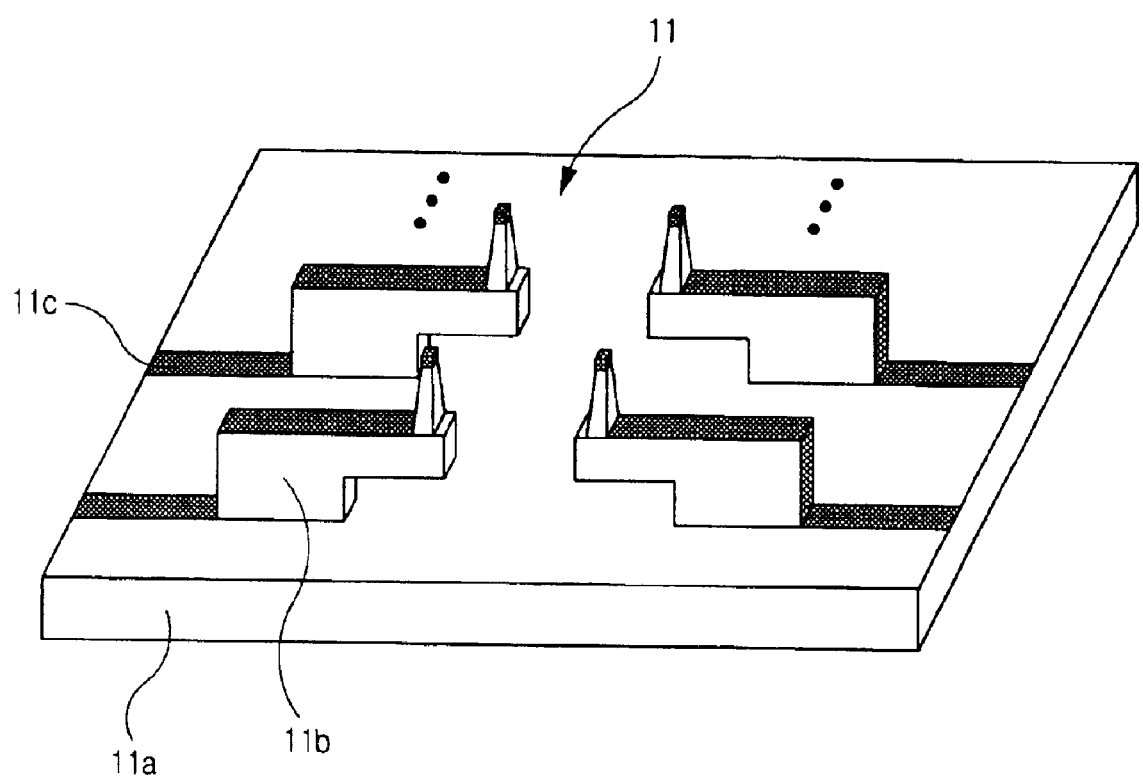
FIG. 7 illustrates the main part of the probe section in FIG. 4.

In these Figures, only 3 probe sections (11) are illustrated. However, required number of plural supporting structures (12) may be provided on the fixing structure (13). The probe section (11) is manufactured according to U.S. Pat. No. 6,414,501. As it is illustrated in FIG. 7, probes (11b) with elasticity are arrayed on the insulated substrate (11a). A hard metal layer is coated to the tip of the probe (11b). The metal wiring (11c) are formed on the insulated substrate (11a).

To decrease the electric resistance and to increase the mechanical hardness of the probe (11b) and the metal wiring (11c) of the probe section (11), electroplating or electroless plating of nickel thin film with a thickness of 1~30 $\mu$m is formed on the probe (11b) and the metal wiring (11c). Then, a thin film of gold layer of 0.1~2 $\mu$m is plated on the nickel thin film. In addition, a groove of 1~150 $\mu$m depth and 1~50 $\mu$m width can be formed on the probe (11b)'s tip prior to metal plating to increase the electric conductivity of the probe (11b)'s tip. The reason of forming the groove is to maintain the electric conductivity even if the metallic plating formed on the probe (11b)'s tip is eroded during the usage of probe card.

The supporting structure (12) is formed by fabricating material that has required elasticity and hardness such as, quartz, invar or kovar (that are kind of steel), or ceramics in a linear shape. When selecting the material for the supporting structure (12), the difference of the heat expansion coefficient between the supporting structure (12) and the insulated substrate (11a) must be considered. If difference of the heat expansion coefficient is large, the bending of the probe section (11) may occur when the manufactured probed card (10) is used at low temperature or high temperature. Preferably, the shape of the supporting structure (12) is determined while considering the size of the probe section (12), the distance between the tips of the probe (11b) and the circuit board (14).

Figure 1:
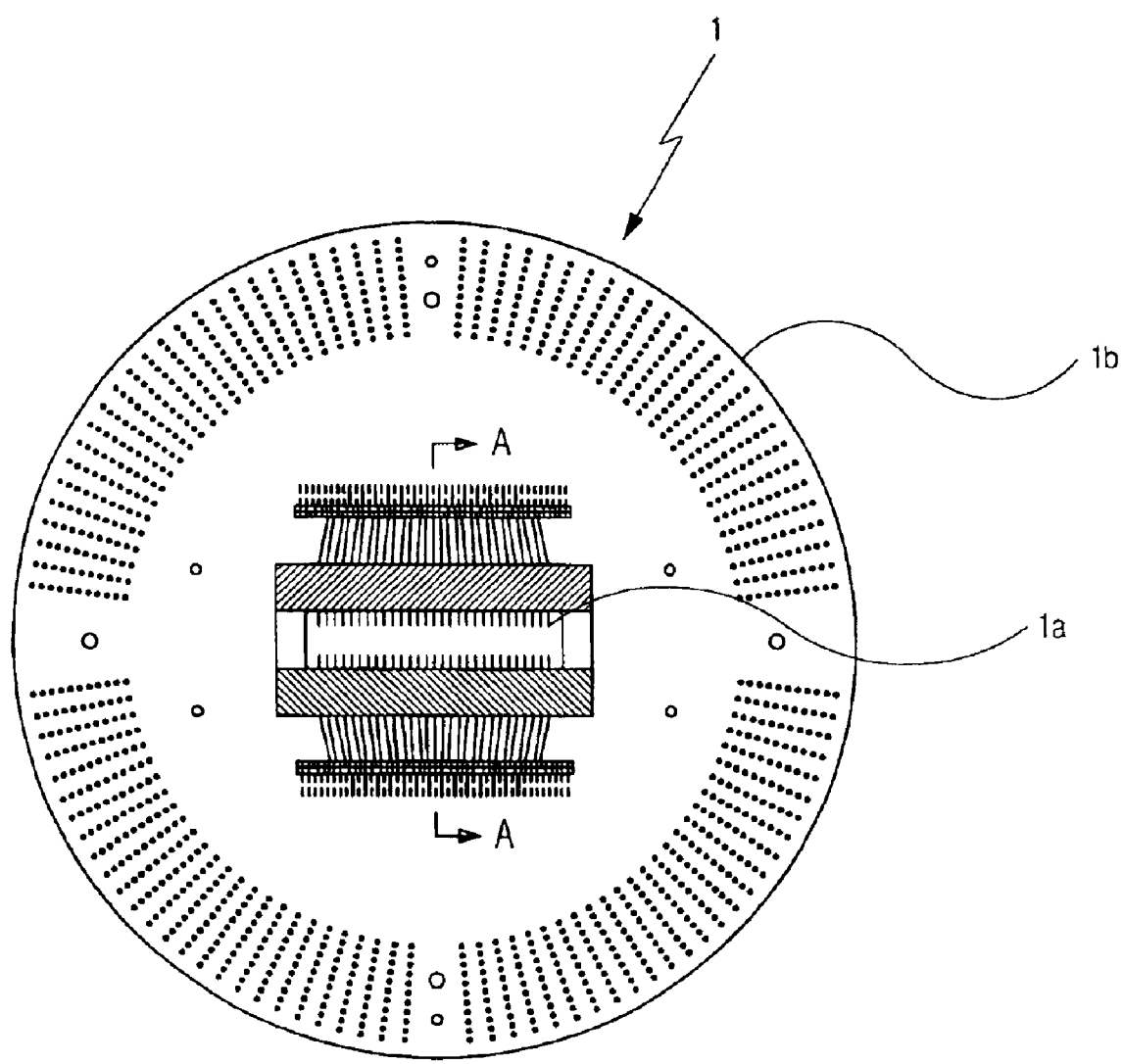
FIG. 1 is a plane figure of the conventional probe card.
Figure 2:
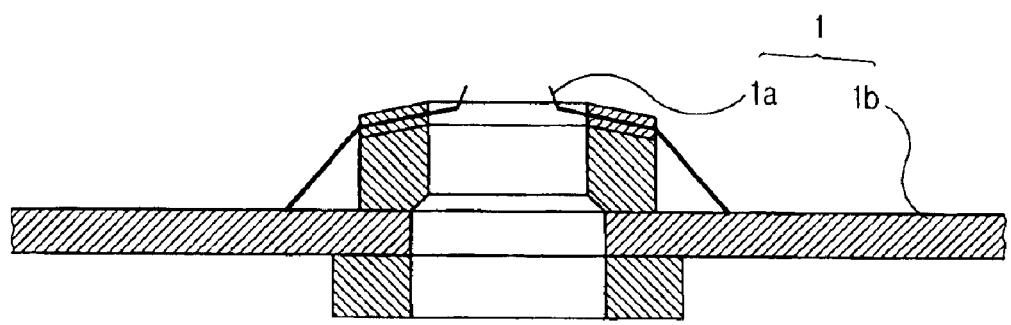
FIG. 2 is a cross sectional view of the probe card along the line A—A in FIG. 1.
Figure 3:
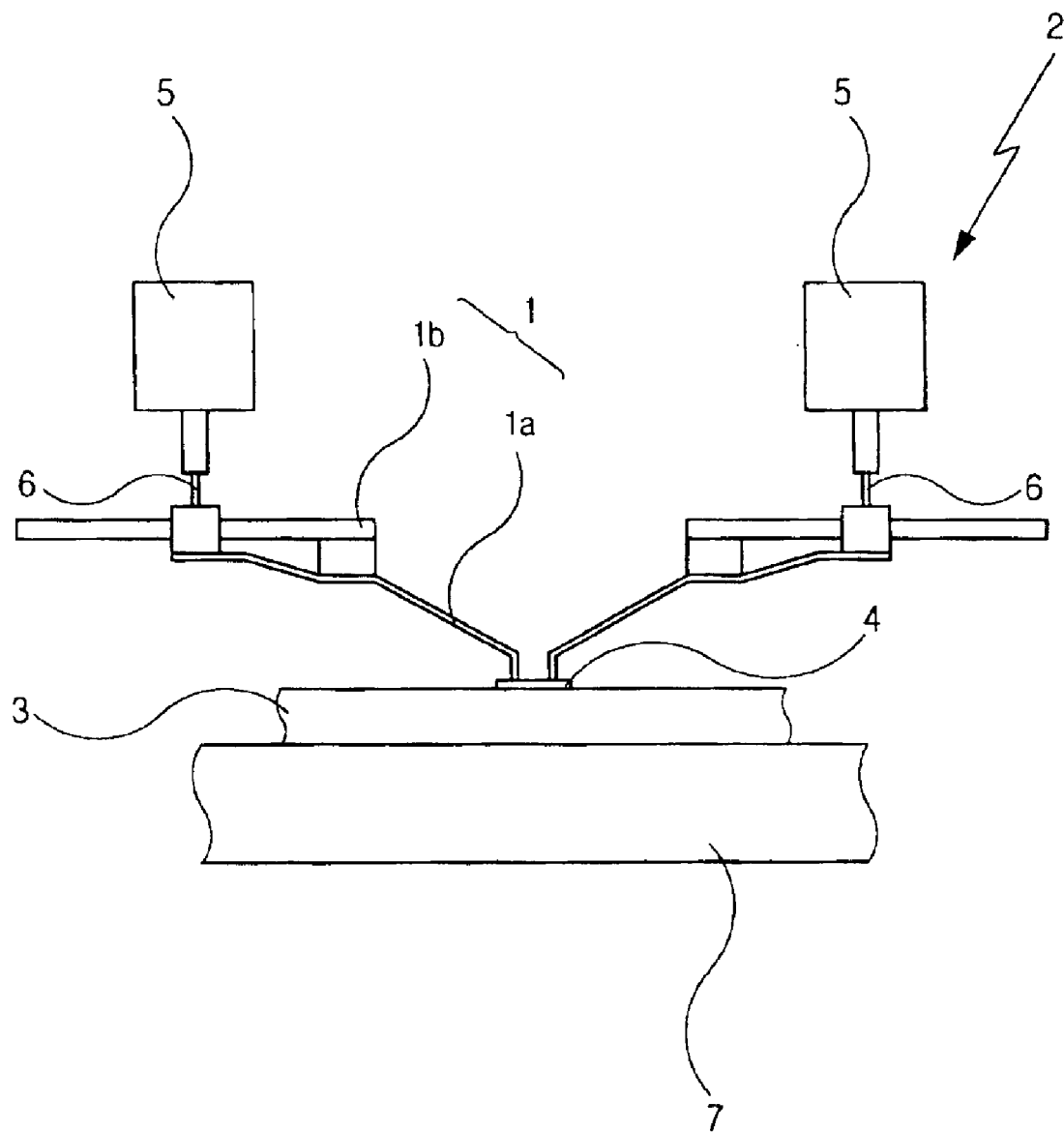
FIG. 3 illustrates a scheme of measurement of a semiconductor wafer using a probe device equipped with a conventional probe card.

The fixing structure (13) for fixing the supporting structure (12) has the structure of a rectangular frame with a rectangular center hole, as illustrated in FIG. 6, with the materials that have the required elasticity and hardness, such as quartz, invar, kovar, or ceramics. In the Figure, the structure of the fixing structure (13) is formed for the installation of the 3 supporting structures (13). However, the fixing structure (13) may be formed to install as many supporting structures (12) as required by the design of the fixing structure (13). In the prior art, there were many constraints to the size of the whole probe card (13) by the size of the circuit board (1b) that fixes the probe (1a) to the probe section (11) in FIG. 1. However, the present invention decreases such constraint considerably.

When installing the supporting structure (12) on the fixing structure (13), screws which may control, set, and fix the 3-dimensional location of the supporting structure (12) in the direction of X, Y and Z axes are provided in the fixing structure (13). The adjustment of the position of the supporting structure (12) is to arrange the probes on the probe section (11) to appropriate position and height within the tolerable error range. On the left side and the right side of the fixing structure (13), 2 screws that control the left and the right location of the supporting structure (12) relative to the fixing structure (13) are provided on the supporting structure (12). At least 1 and less than 10 screws which control the 3 dimensional positions of the supporting structures (12) are installed on each of the supporting structure (12) in order to adjust the position and the planarity between the tips of probes (11) on the supporting structure (12). At least 1 binding screw (17) is installed in order to join the supporting structure (12) to the fixing structure (13) after controlling the 3 dimensional positions. For example, 10 fixing screws (22) are installed to attach the fixing structure (13) on the circuit board (14).

The reinforcing plate (18) is installed below the circuit board (14) to prevent the bend of the circuit board (14) and to attach the fixing structure (13) stably. This reinforcing plate (18) is formed with steel, ceramic or the same material with the fixing structure (13). The reinforcing plate (18), as illustrated in FIG. 6, can be formed as the same size of the fixing structure (13). Within the thickness range of about 1 mm through about 3 cm, the thickness may be adjusted as required. In FIG. 6, the electric wiring of the circuit board (14) has not been illustrated for convenience of the explanation as one skilled in the art will understand the electric wiring of the circuit board (14) and this explanation is not necessary for the purposes of understanding the present invention.

The flexible printed circuit (20) is installed on the area excluding the area where the probe section (11) is installed on the supporting structure (12). If required, the flexible printed circuit (20) may be installed below the probe section (11). Here, for the wire bonding, the end of the electric wiring on the flexible sub printed circuit (20) is extended to the end of the metallic wiring of the probe section (11) on the upper side of the supporting structure (12). The other end of the metallic wiring of the flexible printed circuit (20) is located on the bottom of the supporting structure (12) and forms a pogo pin contact pad (24).

The flexible printed circuit (20)'s electric wiring and the probe section's (11) metallic wiring (11c) are electrically connected by an aluminum or gold (Au) wire (25) by wire bonding. Also, a pogo pin contact pad (26) which corresponds to the flexible printed circuit's pogo pin contact pad (24) is formed on the upper side of the circuit board (14). The flexible printed circuit (20) and the circuit board (14) are designed so that the flexible printed circuit (20)'s pogo pin contact pad and the circuit board (14)'s pogo pin contact pad (26) are arranged in a perpendicular direction.

Figure 10:
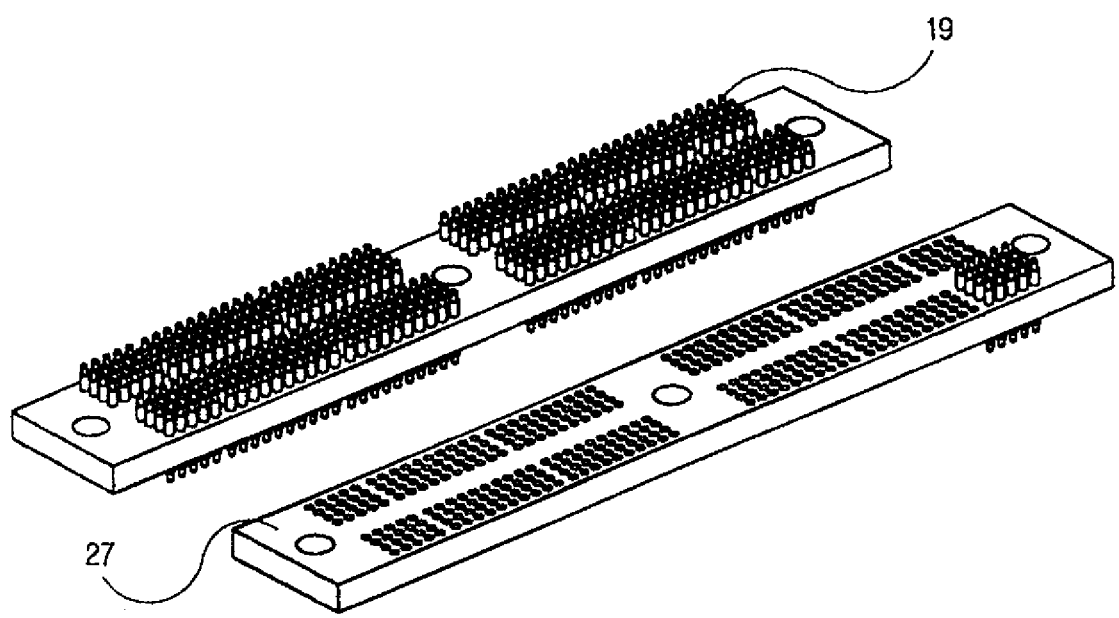
FIG. 10 is a magnified figure of the pogo pin and the pogo pin's fixing object in FIG. 6.

Also, pogo pin fixing object (27) is installed on the center of the upper surface of the circuit board (14), and a combined structure of the probe section (11), supporting structure (12), fixing structure (13), and the flexible printed circuit (20) is installed thereon. The probe (11b) and the circuit board (14) are electrically connected through the metallic wiring (25), and flexible printed circuit, and the pogo pin (19). Here, as illustrated in FIG. 10, the location of the pogo pin fixing object (27) is set so that it can connect the pogo pin (19) contact pad on the flexible printed circuit (20) and the pogo pin contact pad on the circuit board (14). Holes are drilled at the corresponding location of the pogo pin fixing object (27) and the pogo pin (19) is installed in the hole.

Figure 9:
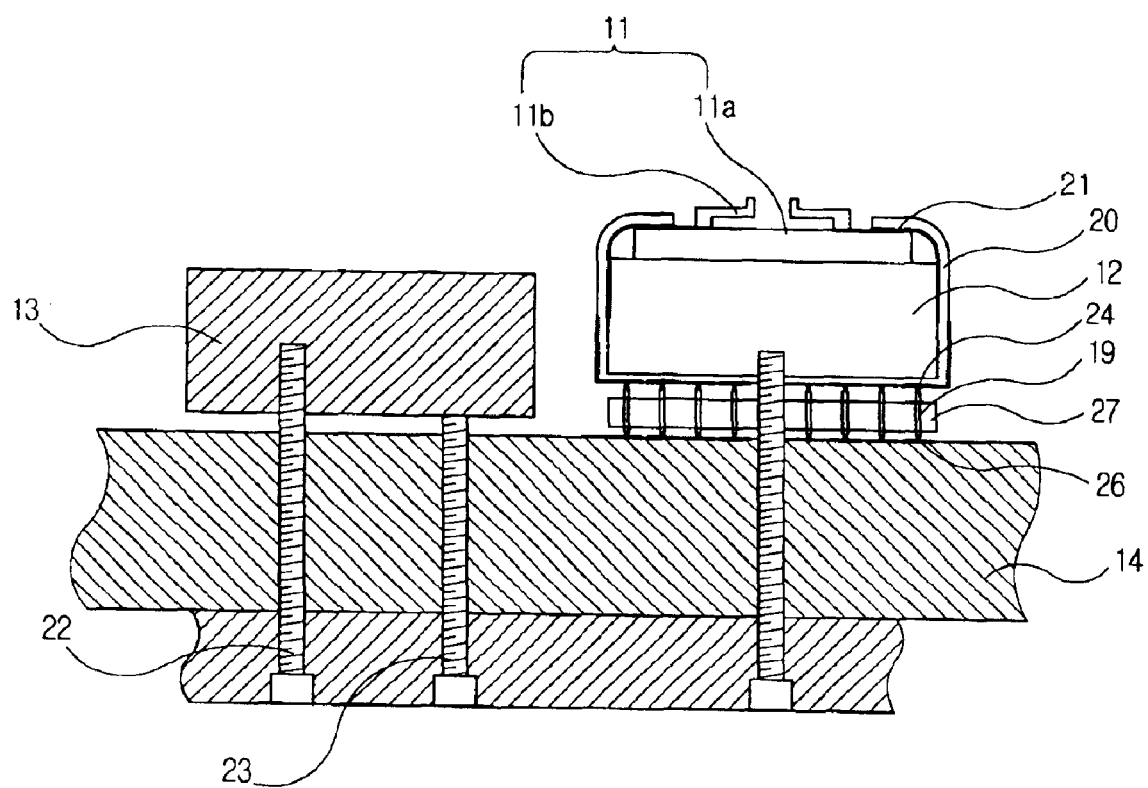
FIG. 9 illustrates another wiring scheme of the probe section and printed circuit board which are provided in the probe card structure of the present invention.

In addition, the probe section (11) and the circuit board (14), as illustrated in FIG. 9, may be electrically connected by the pogo pin (19) and the flexible printed circuit (20). That is, the probe section (11) is fixed on the supporting structure (12), and the end of the electric wiring of the flexible printed circuit (20) is positioned on the end of the metallic wiring of the probe section (11). Here, between the flexible printed circuit (20) and the probe section (11), an anisotropic conducting film (ACF) (21) is placed, and the metallic wiring of the flexible printed circuit board (20) is in contact with the anisotropic conducting film (21). Therefore, an electric wiring is formed between the flexible printed circuit (20) and the probe section (11). The other end of the metallic wiring of the flexible printed circuit (20) is positioned on the bottom of the supporting structure (12) and forms the pogo pin contact pad (24). A pogo pin contact pad (26) corresponding to the pogo pin contact pad (24) flexible printed circuit (14) is also formed on the circuit board (14). Here, preferably, the flexible printed circuit (20) and the circuit board (14) are designed so that the flexible printed circuit (20)'s pogo pin contact pad (24) and the circuit board (14)'s pogo pin contact pad (26) are arranged in a perpendicular direction. The pogo pin (19) is located so that it can connect the pogo pin contact pad on the flexible printed circuit (20) and the pogo pin contact pad on the circuit board (14). Holes are drilled in the pogo pin fixing object (27) and the pogo pin is installed in the hole.

In many cases, the capacitors are installed between the characteristic signal line and the ground line in order to reduce the electric noise. The capacitor can be installed on the flexible printed circuit (20) to reduce the electric noise as much as possible.

In addition, the contact pad of the flexible printed circuit (20) and the contact pad of the circuit board (14) may be electrically connected by a perpendicular conductor of silicon rubber material which conducts electricity between top and bottom surface through vertically embedded metallic wires with a diameter of 35 μm or less, positioned in an array of 0.07~0.45 mm matrix.

The manufacture process of the probe card with such structure is to be explained hereinafter. First, the probe sections (11), for example, are manufactured as required by the method described in U.S. Pat. No. 6,414,501. That is, as illustrated in FIG. 7, in the probe section (11), probes (11b) with elasticity are positioned with predetermined intervals on the insulated circuit board (11a). A hard material layer may be attached to the tip of the probe (11b). A metallic wiring (11c) is formed on the insulated circuit board (11a). Here, for the convenience of explanation of the probe (11b), it is assumed that only 2 probes exist in each row. However, actually, thousands of probes may exist if required.

Then, to reduce the electric noise and to increase the mechanic strength of the probe section (11)'s probes (11b) and the metallic wirings, single or multiple layers of electroplating and/or electroless plating is conducted. For more detail, the nickel electroless plating method is used to deposit the nickel thin film in thickness of 1~30 μm on the probe (11b) and the metallic wiring (11c). Then, using the gold electroless plating method, the gold thin film is deposited in thickness of 0.1~2 μm.

Here, in order to improve the electric conductivity of the probe (11b)s' tips, grooves can be formed on the tip during tip manufacturing prior to the electroless plating. The dimensions of the groove are 1~50 μm width and 1~150 μm depth. The reason for making a groove is to maintain the electric conductivity even if the metallic layer formed on the probe (11b)'s tip is eroded during usage.

The supporting structure (12) is manufactured separately to the manufacture of the probe section (11). That is, board material with the required elasticity and hardness, for example, quartz, invar and kovar (that are kind of steel) or ceramic is processed to manufacture a linear supporting structure (12). When selecting the material for the supporting structure (12), the difference of the heat expansion coefficient between the supporting structure (12) and the insulated circuit board (11a) must be considered. If the difference of the heat expansion coefficient is large, the deformation of the probe section (11) can occur when the manufactured probed card (10) is used at low or high temperature. In extreme cases, the probe section (11) may be damaged. Preferably, the shape of the supporting structure (12) is determined while considering the size of the probe section (12), the distance between the tips of the probe (11) and the circuit board (14). In order to connect with the probe section (11), it is preferable to maintain the processing error of the supporting structure (12).

Then, the probe section (11) is bonded and placed on the supporting structure (12) by a adhesive (not illustrated) such as epoxy resin, and then, the epoxy resin is heated to a temperature of 60~400° C. Here, it is preferable that the adhesive is selected with consideration of the probe card operational temperature.

Subsequently, the electric wiring between the probe section (11) and the circuit board (14) may be formed using, for example, the wire bonding method, the installation of the pogo pin, the use of small printed circuit (hereafter named as sub printed circuit), the use of the flexible printed circuit (20), while considering the circuit board (14)'s structure and wiring distance. In addition, in order to reduce the electrical noise, a capacitor (not illustrated) may be installed on the flexible printed circuit (20).

A wiring scheme using the wire bonding, the flexible printed circuit and POGO pins are explained by referring to FIG. 8. The flexible printed circuit (20) is placed in the area beside the probe section (11) on the supporting structure (12). Here, the end of the electrical wiring on the flexible printed circuit (20) is extended to near the end of the metallic wiring of the probe section (11) on the upper side of the supporting structure (12) and for wire bonding. The other end of the metallic wiring of the flexible printed circuit (20) is located on the bottom of the supporting structure (12) and forms the pogo pin contact pad (24).

Then, using the wire bonding method, the metallic wiring of the probe section (11) and the electrical wiring of the flexible printed circuit (20) is electrically connected by an aluminum of a gold (Au) wire (25). The pogo pin contact pad (26) which corresponds to the pogo pin contact pad of the flexible printed circuit (14c) is also formed on the circuit board (14). Here, it is preferable for the flexible printed circuit (20) and the circuit board (14) is designed so that the pogo pin contact pad (24) of the flexible printed circuit (20) and the contact pad (26) of the circuit board (14) are arranged in a perpendicular direction.

Then, the pogo pin fixing object (27) is installed on the circuit board (14), and a combined structure of the probe section (11), supporting structure (12), fixing structure (13) and flexible printed circuit (20) are provided thereon. Thus, the probe (11b) and the circuit board (14) are electrically connected by the metallic wire (25), the flexible printed circuit (20), and the pogo pin (19).

Here, as illustrated in FIG. 10, the pogo pin fixing object (27)'s position is set so that it could connect the pogo pin contact pad of the flexible printed circuit (20) which fixes the pogo pin (19) and the contact pad of the circuit board (14). Holes are drilled in the location of the pogo pin fixing object (27) and then the pogo pin (19) is installed in that hole.

For electrically wiring the probe section (11) and the circuit board (14), another example that uses the pogo pin and the flexible printed circuit is explained by referring to FIG. 9. The end of the electrical wiring of the flexible printed circuit (20) is installed on the end section of the metallic wiring of the probe section (11). Here, an anisotropic conducting film (21) is placed between the flexible printed circuit (20) and the probe section (11). After contacting the metallic wiring of the flexible printed circuit (20) to the anisotropic conducting film (21), the flexible printed circuit (20) is heated to a temperature of 50~300° C. under pressure. Therefore, an electrically wired connection between the flexible printed circuit (20) and the probe section (11) is formed.

Here, the other end of the metallic wiring of the flexible printed circuit (20) is located on the bottom of the supporting structure (12) and forms the pogo pin contact pad (24). Also, on the circuit board (14), a pogo pin contact pad (26) which corresponds to the pogo pin contact pad (24) on the flexible printed circuit (14) is formed. Here, it is preferable for the flexible printed circuit (20) and the circuit board (14) is designed so that the pogo pin contact pad (24) of the flexible printed circuit (20) and the contact pad (26) of the circuit board (14) are arranged in a perpendicular direction. The position of the pogo pin (19) is set so that the pogo pin contact pad of the flexible printed circuit (20) and the contact pad of the circuit board (14) may be connected. Holes are drilled on the pogo pin fixing object (27) and fixes the position so that the pogo pin can be installed in that hole.

Instead of using POGO pins and pogo pin fixing object (27), the contact pad of the flexible printed circuit (20) and the contact pad of the circuit board (14) may be electrically connected by a perpendicular conductor of silicon rubber material which conducts electricity between top and bottom surface through vertically embedded metallic wires with a diameter of 35 μm or less, positioned in an array of 0.07~0.45 mm matrix.

Instead of using flexible printed circuit (FPC) as sub printed circuit, small rigid printed circuit board (PCB) can be used. In this case, one or more small PCB are attached to the side of supporting structure using adhesive, and these PCB(s) contain appropriate electrical wirings from the top to the bottom. Another type of one or more small PCB(s) are installed at the bottom surface of the supporting structure, which contain appropriate electrical wirings and pad which correspond to the POGP pad on the circuit board. Then, the metal wiring on the probe section and the small PCB attached to the side of the supporting structure are connected electrically using wire bonding. Also, the small PCBs attached to the side of the supporting structure and to the bottom of the supporting structure are appropriately connected electrically using wire bonding.

In many cases, the capacitors are installed between the characteristic signal line and the ground line in order to reduce the electric noise. The capacitor can be installed on the sub printed circuit (20) to reduce the electric noise as much as possible. This can be done by arranging the wiring on the sub printed circuit accordingly and providing a small space in the supporting structure to accommodate the capacitors.

Then, the supporting structure (12) is fixed on the fixing structure (13). The fixing structure (13) for holding the supporting structure (12) in place is manufactured as illustrated in FIG. 6 with the materials that have the required elasticity and hardness, such as quartz, invar, kovar, or ceramics. Although it is shown in the figure that 3 of the supporting structures (13) are installed, the fixing structure (13) may be manufactured so that the required number of supporting structures (12) may be installed by the design of the fixing structure. Therefore, the constraint on the size of the entire probe card (10) by the size of the circuit board (11a) that fixes the probe (11b) of the probe section (11) may be reduced.

In addition, when installing the supporting structure (12) on the fixing structure (13), screws which may control, set, and fix the 3-dimensional location of the supporting structure (12) in the direction of X, Y and Z axes are provided in the fixing structure (13). The adjustment of the position of the supporting structure (12) is to arrange the probes on the probe section (11) to appropriate position and height within the tolerable error range. On the left side and the right side of the fixing structure (13), 2 screws that control the left and the right location of the supporting structure (12) relative to the fixing structure (13) are provided on the supporting structure (12) or in the fixing structure.

Then, the 3-dimensional position of the supporting structure (12) is adjusted by the screws (15), (16), and, a microscope and observer camera is used to confirm the supporting structure (12) has moved to the intended location. After confirming that the supporting structure (12) has at the intended position, the fixing structure (13) is connected to the circuit board (14).

When attaching the fixing structure (13) to the circuit board (14), because the surface formed by the probe's tip of the probe section (11) must have the planarity in the tolerable range in relation to the circuit board (14), 1 to 10 screws which may adjust the planarity are installed on the fixing structure (13). In the figure, 3 screws are installed. When the planarity adjustment cannot be done by the screws alone, it is possible to install at least 1 spring between the fixing circuit board and the circuit board. In order to prevent bending of the circuit board (14) and to fix the fixing structure (13) stably, a reinforcing plate (18) with such as steel or the same material with the fixing structure (13) may be installed below the circuit board (14). As it is illustrated in FIG. 6, the reinforcing plate (18) can be as of the same size of the fixing structure (13), and the thickness may be adjusted between the range of 1 mm~3 cm thickness as required. In addition, even though the electric wiring of the circuit board (14) was not illustrated in FIG. 6 for the convenience of explanation, it is obvious that there is electric wiring on the circuit board (14).

As it is explained above, according to the present invention, the life time of the probe card made of silicon is extended because the metallic layer of the probe and probe tip's groove is plated. It is more easier to adjust the position, planarity and the electrical wiring connection between the probes when manufacturing the vertical type probe card. It reduces the probe card manufacturing costs by enabling only the damaged probes during manufacturing to be discarded and the others to be used continually.

The bending characteristics have been improved, the size constraints of the possible manufactured probe card has been lightened. Moreover, the total wiring length has been shortened. Because the distance between the probe and capacitor is short when installing the capacitor, the electric noise characteristics have been also improved. If a defect occurs in some probes during the use of the probe card, the cost of maintenance can be reduced by replacing only the damaged probes section instead of the entire circuit board.

The present invention is not limited to the attached drawings and detailed description of the present invention set forth above. Rather, it is apparent to the persons with ordinary knowledge in the relevant field that the present invention may be modified and changed in various manners within the extent not exceeding the essence of the present invention claimed in the following claims.

What is claimed is:

1. A probe card structure comprising:

a probe section having an insulated circuit board, a probe of silicon material formed on said insulated circuit board for contacting a pad of a device to be measured, and a conductive wiring in electrical communication with said probe and disposed on said insulated circuit board;

a supporting structure for supporting said probe section;

a fixing structure for fixing a plurality of said supporting structures together;

a printed circuit having a conductive wiring connected to said fixing structure, said printed circuit being electrically connected to a measurement device for transmitting a measurement signal to said device being measured;

a wiring connection for electrically connecting said conductive wiring of said probe and said conductive wiring in communication with said printed circuit, wherein said conductive wiring of said probe section and said conductive wiring of said printed circuit are electrically connected by a sub printed circuit, said sub printed circuit being selected from the group consisting of a flexible printed circuit, a rigid printed circuit board, and any combinations thereof; and a contact pad of said sub printed circuit and a contact pad of said insulated circuit board being electrically connected by perpendicular conductor of silicon rubber material for conducting electricity between a top surface and a bottom surface through a plurality of vertically embedded metallic wires having a diameter of 35 $\mu$m or less, wherein said plurality of vertically embedded metallic wires are positioned in an array of a 0.07 through 0.45 mm matrix.

* * * * *